United States Patent [19]

Morris et al.

[11] Patent Number: 4,940,849

[45] Date of Patent: * Jul. 10, 1990

[54] METALLIZING PASTE

[75] Inventors: Michael Morris, Sheffield; John Vickers, Ulverston, both of England

[73] Assignee: Oxley Developments Company Limited, London, England

[*] Notice: The portion of the term of this patent subsequent to Jan. 24, 2006 has been disclaimed.

[21] Appl. No.: 244,413

[22] Filed: Sep. 9, 1988

Related U.S. Application Data

[62] Division of Ser. No. 924,302, Oct. 23, 1986, Pat. No. 4,799,958.

[30] Foreign Application Priority Data

Oct. 25, 1985 [GB] United Kingdom ............... 8526397

[51] Int. Cl.$^5$ ............................................. B32B 9/00
[52] U.S. Cl. .................................... 428/209; 428/210; 428/328; 428/330; 428/426; 428/432; 428/433; 428/901; 252/512; 252/513; 252/515; 252/518; 106/1.12
[58] Field of Search ............... 106/1.12; 252/512, 513, 252/515, 518; 428/209, 210, 328, 330, 426, 432, 433, 901

[56] References Cited

U.S. PATENT DOCUMENTS

| | | | |
|---|---|---|---|
| 4,051,074 | 9/1977 | Asada | 252/515 |
| 4,381,198 | 4/1983 | Kondo et al. | 106/1.12 |
| 4,799,958 | 1/1989 | Morris et al. | 106/1.12 |

FOREIGN PATENT DOCUMENTS

| | | | |
|---|---|---|---|
| 0144482 | 11/1980 | Japan | 106/1.12 |
| 0160705 | 12/1981 | Japan | 252/515 |

Primary Examiner—Patrick Ryan
Attorney, Agent, or Firm—Gipple & Hale

[57] ABSTRACT

A metallizing paste capable of being used for screen printing applications which comprises tungsten powder and an organic vehicle system. The organic vehicle system can comprise a polymeric material, such as ethyl cellulose, and a solvent, such as terpineol and the paste preferably includes frit material, of alumina, cerium fluoride, bismuth oxide and silica and may also include manganese and/or nickel.

There is also disclosed a semi-conductor package made using the metallization paste. The package includes conductive attachment area, conductive feed-through paths, conductive vias and a conductive external underside, all of which are formed using the metallization paste in various formulations.

7 Claims, 1 Drawing Sheet

METALLIZING PASTE

The invention relates to metallising pastes, and in particular, but not exclusively, to metallising pastes which may be fired at high temperatures.

The use of low-temperature-firing metallising pastes as intermediates in the electroplating of pre-sintered ceramics is widespread, for example, in the manufacture of ceramic packages for mounting a semiconductor device, wherein pastes as screen-printed onto ceramic components of the package. These form a metallic base onto which other metals may be electroplated to provide electrical and thermal contact with the semiconductor device within the package. Many metals may be used in the pastes, for example, silver, nickel and copper.

However, in some applications it would be advantageous if the paste could be deposited on a "green" (i.e. unsintered) ceramic and subsequently co-fired with the ceramic at temperatures up to 1,600° C. However, at such temperatures the known pastes described above do not provide acceptable results.

In accordance with the present invention, there is provided a metallising paste comprising tungsten and an organic vehicle system.

This provides a screen-printable refractory metal formulation which when co-fired with a ceramic (e.g. alumina) or fired onto pre-sintered ceramic yields an adherent, electrically conductive metallised area, upon which a variety of metals may be electroplated.

Preferably, the paste further comprises frit material.

The tungsten may be in the form of a powder, advantageously comprising particles of approximately one micron in size.

The organic vehicle system preferably comprises a polymeric material, e.g. ethyl cellulose, and an appropriate solvent, e.g. terpineol, which are preferably mixed in the ratio 1 to 12 by weight.

The weight of the vehicle system is preferably from 20% to 50%, and more preferably 35%, of the weight of the paste.

The first material preferably comprises one or more of alumina, cerium fluoride, bismuth oxide and silica, which preferably are present in equal proportions.

The ratio of tungsten to frit in the paste may be from 100 to 0 to 50 to 50 parts by weight. For example, the ratio may be 90 to 10, 60 to 40 or 99 to 1.

Other compositions could contain up to 20% by weight of manganese and/or 10% weight of nickel, in addition to tungsten and the frit materials.

The advantages of such compositions are that the addition of manganese allows the percentage of non-conductive frit materials within the paste to be reduced since the manganese itself will bond chemically to the ceramic substrate.

The addition of small amounts of nickel is advantageous in that the presence of this metal facilitates the subsequent electrodeless nickel plating of the fired metallisation.

The invention also includes an article formed using a metallising paste in accordance with the invention.

By way of example only, a specific embodiment of the present invention will now be described, with reference to the accompanying drawings and examples, in which:

EXAMPLE 1

A mixture A according to the present invention comprises 90 parts by weight of high purity tungsten powder, the tungsten powder being 99.9% pure and having an average grain size of one micron. The tungsten powder is mixed with 10 parts by weight of frit material, comprising alumina, cerium fluoride, bismuth oxide and silica in equal proportions by weight. The constituents of the frit material are passed through a 45 micron sieve so that the frit material does not contain particles of size greater than 45 microns. To the mixture of tungsten powder and frit material is added an organic vehicle solution comprising 9 parts by weight of terpineol (which acts as a solvent) and one part by weight of ethyl cellulose which is a polymeric binder material. The resultant mixture A is 70% by weight of tungsten and frit and 30% by weight of vehicle solution. The addition of the vehicle solution forms a metallising paste having viscosity suitable for screen-printing.

EXAMPLES 2 AND 3

Mixtures B and C according to the present invention are similar to mixture A, except that mixture B has a minimal proportion of frit material content, in the present case 1 part to 99 parts by weight tungsten powder, and mixture C has a high proportion of frit material, i.e. 40 parts to 60 parts by weight of tungsten in the present case.

It should be appreciated that the amount of frit material in 100 parts by weight of a tungsten and frit mixture, which, with the vehicle system, forms a mixture according to the present invention may be as low as zero parts, as high as 50 parts, and may take any value in between. All such tungsten and frit mixtures as described in Examples 1 to 3, when mixed with vehicle solution, provide a paste which may be screen printed directly onto "green" (i.e. unsintered) alumina and co-fired,in a reducing atmosphere, at 1,500° C. or above, or which may be applied to pre-sintered alumina and fired at temperatures as low as 1,200° C., in both cases to provide adherent, electrically conductive metallised areas upon which a variety of metals may be subsequently electroplated.

It should also be appreciated that the resultant tungsten/frit mixture may comprise from 50% to 80% by weight of the total mixture.

Figure 1:
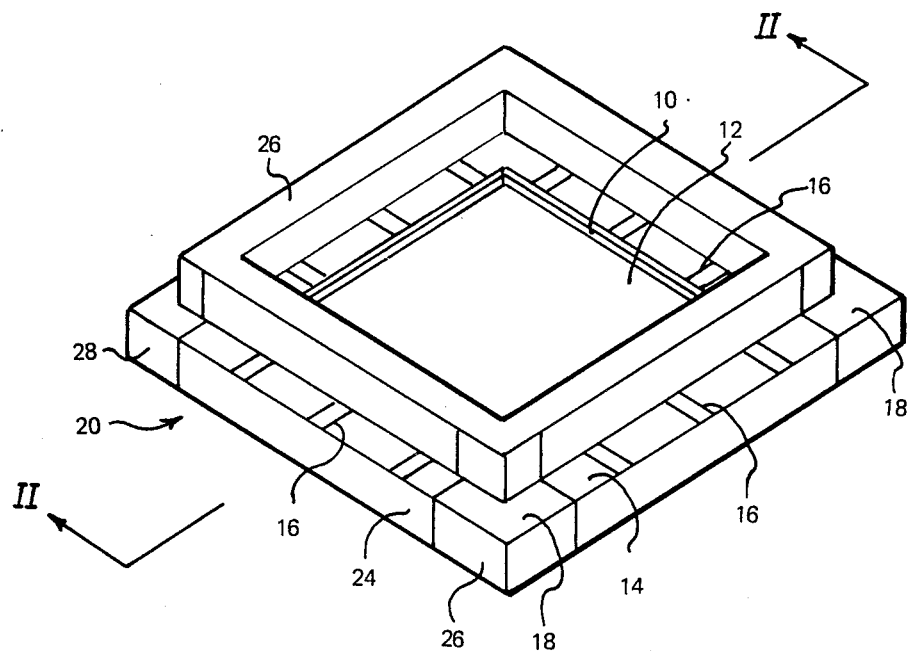
FIG. 1 is a perspective view of an embodiment of a semiconductor device package formed using a metallising paste in accordance with the present invention.
Figure 2:
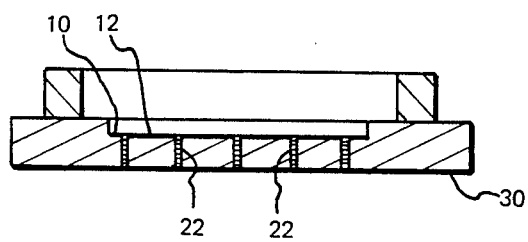
FIG. 2 is a sectional veiw on the line II-II in FIG. 1.

Referring to FIGS. 1 and 2, a semiconductor package device is shown. This comprises a plurality of sheets (not individually visible in the drawings) of alumina, one 10 of which is screen-printed with mixture A to provide a rectangular die attachment area 12. Another sheet 14 of alumina is screen-printed with mixture A to form feedthroughs 16 and horizontal, corner metallisation areas 18.

The sheets of alumina are laminated and co-fired to yield a monolithic structure 20 about which are positioned adherent electrically conductive tungsten metallised areas.

After the structure 20 has been cut to size and suitably lapped, mixture B is introduced into via holes 22 which extend through the base 24 of the structure 20 to the die attachment area 12. When filled with mixture B, the resulting metal structures in the via holes provide good electrical and thermal conductivity between the die attachment area and the undersurface of the structure 20.

Mixture C is screen-printed on the upper surface of the structure 20 to provide a lid attachment area 26, and also on the sides to provide vertical, corner metallisation areas 28 and also on the undersurface 30 of the structure 20.

The whole structure is then re-fired at 1,250° C. in a reducing atmosphere and the metallised areas which remain are finished conventionally, in gold over a nickel undercoat.

We claim:

1. A package for a semi-conductor comprising a laminated stack of sheets of alumina on which there is screen printed, firstly, a generally rectangular attachment area for receiving a semi-conductor device and, secondly, a plurality of feedthrough paths for enabling external electrical communication with said semi-conductor device from the outside of said package, said rectangular attachment area and said feed through paths being screen-printed with a metallizing paste comprising the combination of:
   (a) tungsten powder;
   (b) frit material consisting of alumina, cerium fluoride, bismuth oxide and silica of particle size less than 45 microns; and
   (c) an organic vehicle system in an amount between 20–50% by weight of the paste.

2. A semi-conductor package according to claim 1, wherein a plurality of holes are formed through said stack of alumina sheets and filled with further quantities of said metallising paste for electrically connecting said conductive rectangular attachment area with another conductive layer disposed on an exterior surface of the package and formed by a further screen-printed layer of said metallising paste.

3. A semi-conductor package according to claim 2, wherein the metallising paste used to form said attachment area comprises a mixture of approximately 90 parts by weight of tungsten powder and approximately 10 parts by weight of said frit material, the frit material comprising alumina, cerium fluoride, bismuth oxide and silica in equal proportions by weight, and wherein said organic vehicle system comprises approximately 9 parts by weight of terpineol and one part by weight of ethyl cellulose.

4. A semi-conductor package according to claim 2, wherein the metallising paste used to form said holes comprises a mixture of approximately 99 parts by weight of tungsten powder and 1 part by weight of said frit material, said frit material comprising alumina, cerium fluoride, bismuth oxide and silica in equal proportions by weight, and wherein said organic vehicle system comprises approximately 9 parts by weight of terpineol and one part by weight of ethyl cellulose.

5. A semi-conductor package according to claim 2 wherein the metallising paste used to form said conductive layer disposed on the exterior surface of the package comprises a mixture of 50 to 60 parts by weight of tungsten powder and 50 to 40 parts by weight of said frit material, the frit material comprising alumina, cerium fluoride, bismuth oxide and silica in equal proportions by weight, and wherein said organic vehicle system comprises approximately 9 parts by weight of terpineol and one part by weight of ethyl cellulose.

6. A package for a semi-conductor comprising a laminated stack of sheets of alumina on which there is screen printed, firstly, a generally rectangular attachment area for receiving a semi-conductor device and, secondly, a plurality of feed through paths for enabling external electrical communication with said semi-conductor device from the outside of said package, said rectangular attachment area and said feed through paths being screen printed with a metallisation paste comprising the combination of:
   (a) tungsten powder;
   (b) frit material comprising of alumina, cerium fluoride, bismuth oxide and silica of particle size less than 45 microns; and
   (c) an organic vehicle system; wherein:
      (1) the tungsten plus frit in the paste lies in an amount ranging between 50–80% by weight of the paste,
      (2) the organic vehicle system in the paste lies in an amount ranging between 20–50% by weight of the paste, and
      (3) the ratio of tungsten to frit in the paste lies in an amount ranging between 50 to 99 parts tungsten powder to 50 to 1 parts of frit material.

7. A metallizing paste comprising in combination:
   (a) tungsten powder;
   (b) Frit material consisting of alumina, cerium fluoride, bismuth oxide and silica in equal proportions by weight; and
   (c) an organic vehicle system; wherein:
      (1) the tungsten plus frit in the paste lies in an amount between 50–80% by weight of the paste,
      (2) the organic vehicle system in the paste lies in an amount between 20–50% by weight of the paste, and
      (3) the ratio of tungsten to frit in the paste lies in an amount between 50 to 99 parts tungsten powder to 50 to 1 parts of frit material.

* * * * *